(12) United States Patent
Ku

(10) Patent No.: US 7,087,439 B2
(45) Date of Patent: Aug. 8, 2006

(54) METHOD AND APPARATUS FOR THERMALLY ASSISTED TESTING OF INTEGRATED CIRCUITS

(75) Inventor: Joseph Weiyeh Ku, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 107 days.

(21) Appl. No.: 10/655,892

(22) Filed: Sep. 4, 2003

(65) Prior Publication Data

US 2005/0054125 A1 Mar. 10, 2005

(51) Int. Cl.
*H01L 21/00* (2006.01)

(52) U.S. Cl. .......................................... 438/6; 257/678

(58) Field of Classification Search ................ 438/6, 438/11, 16, 115, 663, 680, 716, 770, 773, 438/778, 787, 795, 7, 696, 700, 703, 720–724, 438/735; 156/345; 257/677, 678, 783; 702/30, 702/182, 94

See application file for complete search history.

(56) References Cited

U.S. PATENT DOCUMENTS

| | | | |
|---|---|---|---|
| 4,734,872 A | 3/1988 | Eager et al. | |
| 4,855,672 A | 8/1989 | Shreeve | |
| 6,060,895 A * | 5/2000 | Soh et al. | 324/760 |
| 6,163,866 A | 12/2000 | Ansari | |
| 6,191,599 B1 | 2/2001 | Stevens | |
| 6,545,494 B1 | 4/2003 | Olsen et al. | |
| 6,791,171 B1 * | 9/2004 | Mok et al. | 257/678 |
| 2003/0158697 A1 * | 8/2003 | Gold et al. | 702/132 |

* cited by examiner

*Primary Examiner*—Michael Lebentritt
*Assistant Examiner*—Andre' Stevenson

(57) ABSTRACT

A system and method for thermally testing integrated circuits, comprising a temperature generation device located within the IC, configured with a primary purpose of affecting a temperature at the IC. A temperature sensor is located within close proximity to the IC, and a temperature controller is coupled to the temperature generation device and to the temperature sensor.

25 Claims, 6 Drawing Sheets

METHOD AND APPARATUS FOR THERMALLY ASSISTED TESTING OF INTEGRATED CIRCUITS

BACKGROUND OF THE INVENTION

1. Field of the Invention

The present invention relates generally to the testing of integrated circuits (ICs). More particularly, the invention relates to the accurate testing of an IC at a pre-determined temperature, by installing temperature generation devices and temperature sensors within the IC.

2. Background

As technology advances, electronic components have become smaller and faster. Consequently, electronic components are producing hotter temperatures than before. Due to the ever-increasing amounts of heat produced in electronic systems, it is vital that electronic components, such as ICs, accurately specify the temperature range in which they can reliably operate. However, because of the complexity of modern electronic systems, determining the temperature range specification of an IC has become increasingly difficult.

Attempts to accurately determine the temperature range specification by running tests on integrated circuits in a tightly controlled temperature chamber have been largely unsuccessful. While the chamber can control the ambient temperature of the IC, the chamber cannot control the temperatures generated by the IC during its functional test or by peripheral devices surrounding the IC if it is placed in its operating environment. In modern ICs, high levels of transient currents can cause temperatures on the IC to rise within microseconds. Because of the volatile nature of modern ICs, temperature chambers are unable to precisely control the exact temperature on the chip itself. Other off-chip heat generation devices or off-chip temperature sensors have similar limitations.

Furthermore, a temperature chamber may not accurately simulate the operating environment in which many ICs will be placed. For example, when a central processing unit (CPU) is placed in its operating environment, it is surrounded by peripheral devices that generate different levels of heat, thus affecting the ambient temperature. Furthermore, it is surrounded by a computer case that also affects the ambient temperature. The performance and reliability of the CPU largely depend on the surrounding ambient temperature. The ambient temperature, in turn, depends on the heat generated by the CPU. However, none of these effects are replicated when an IC is tested in a temperature chamber. An additional disadvantage of using a temperature chamber is that a temperature chamber is large and expensive.

SUMMARY OF THE INVENTION

It has been recognized that it would be advantageous to develop a method and system for accurately testing the electrical characteristics of an integrated circuit (IC) under thermal conditions such that manufacturers could precisely guarantee the temperature specification of their ICs.

The invention provides a method and system for thermally testing an IC. The system includes a temperature generation device located within the IC, having a primary purpose of affecting a temperature at the IC. The system may also include a temperature sensor in close proximity to the IC and a temperature controller coupled to the temperature generation device and the temperature sensor. The IC is prepared for thermal testing by designing a layout of the IC to include a temperature generation device to be positioned within the IC, constructing the IC with the temperature generation device positioned within the IC, and providing a user with a means to operate the temperature generation device to perform thermal testing on the IC. Finally, the method is practiced by operating a temperature generation device located within the IC for the purpose of affecting the temperature at the IC, and sensing a temperature associated with the IC.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 1:
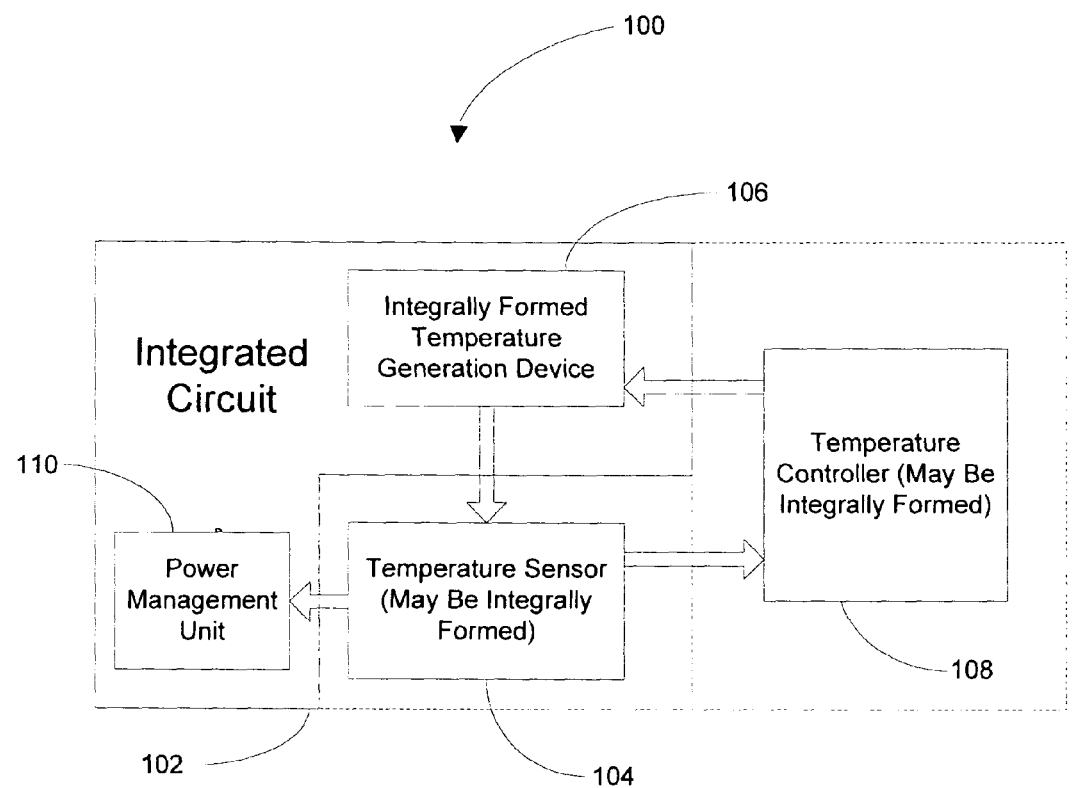
FIG. 1 is a schematic block diagram of the thermally assisted testing system in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As illustrated in FIG. 1, a system 100 is shown for thermally assisted testing of an IC, in accordance with the present invention. The system includes a temperature generation device 106 located within the IC 102, and a temperature sensor 104 located within close proximity to the IC 102, electronically coupled to the temperature generation device. The system also includes a temperature controller 108 electronically coupled to the temperature generation device 106 and to the temperature sensor 104.

Figure 2:
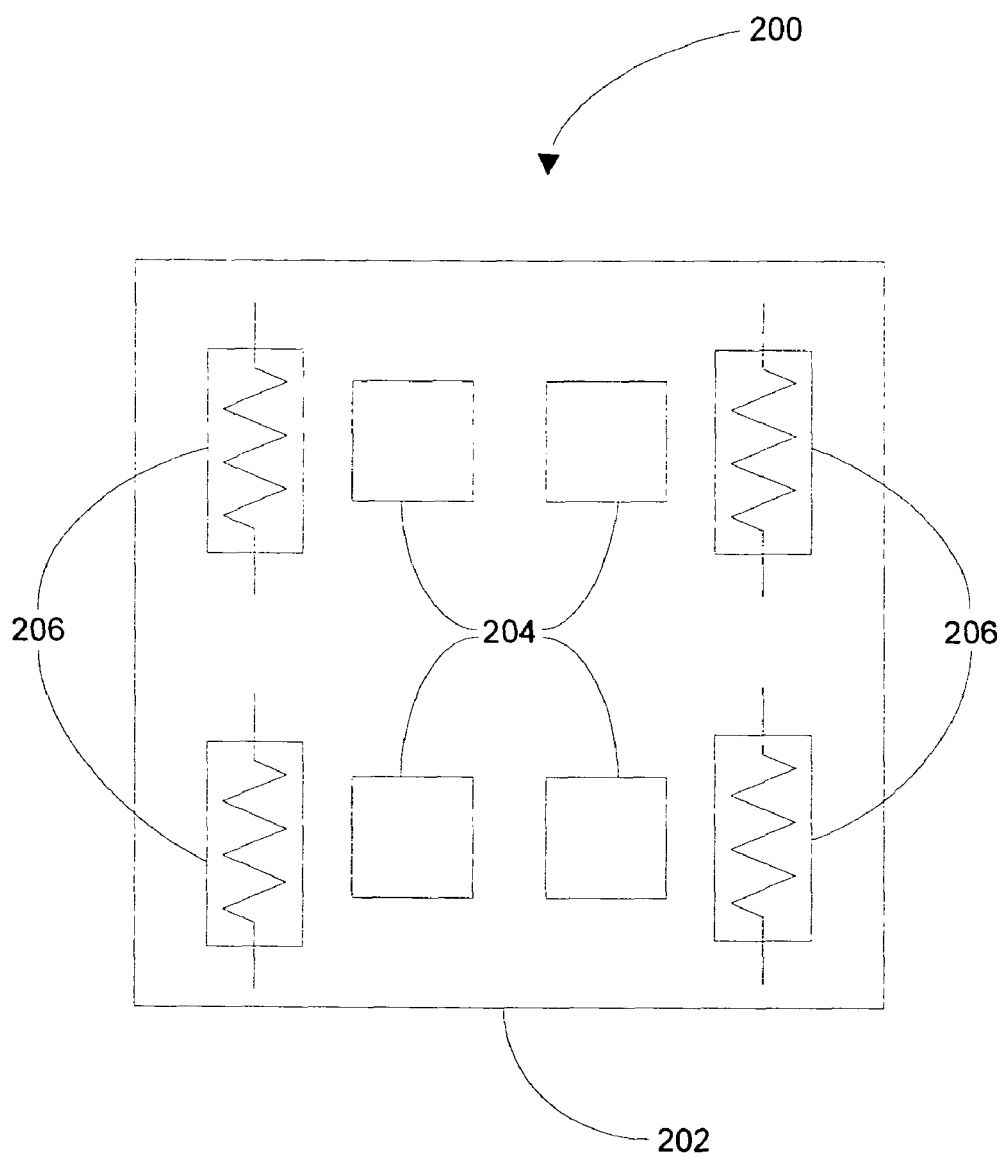
FIG. 2 is a block diagram of an IC, wherein a plurality of temperature sensors and temperature generation devices are located at various positions throughout the IC.

The temperature sensor 104 may be located within the IC, as indicated by the dotted lines surrounding the temperature sensor. The temperature sensor 104 may be positioned within the IC 102 in an area that is indicative of the overall temperature of the body of the IC 102. The temperature sensor may also be placed in an area that is indicative of localized hottest areas within the IC 102. As illustrated in FIG. 2, multiple temperature sensors 204 may be positioned throughout the IC 202 to provide a thorough depiction of the temperature on the IC 202. By integrally forming the temperature sensor 104 as part of the IC 102, the exact temperature of the IC can be acquired, as opposed to the ambient temperature normally sensed by off-chip temperature sensors. Because the integrally formed temperature sensor provides highly indicative temperature readings, manufacturers are enabled to more precisely guarantee the temperature specifications of their ICs. Examples of temperature sensors may include, but are not limited to, semiconductor P/N junctions such as diodes or bipolar transistors. In the case of bipolar transistors, a base-emitter junction voltage may be used as the temperature gauge, where the temperature may be determined from the current flow through the junction.

The temperature generation device 106 is defined as either a heat generation device, a cooling device, or a combination of a heat generation device and a cooling device. The temperature generation device 106 may be positioned such that it is thermally coupled directly to the main body of the IC to facilitate a rapid temperature response of the IC 102.

As shown in FIG. 2, multiple temperature generation devices 206 may be positioned throughout the IC 202 so that a high level of control may be had over the temperature of the entire IC 202. The multiple temperature generation devices 206 may be used to provide varying temperatures at different locations on the IC 202. Conversely, the multiple temperature generation devices 206 may be used to ensure that the entire IC 202 is maintained roughly at an identical temperature.

By integrally forming the temperature generation device as part of the IC, a more precise temperature control and rapid temperature response can be produced than is possible with a temperature chamber, or other off-chip temperature control devices. Examples of heat generation devices may include, but are not limited to, resistive elements such as diffusion resistors or polysilicon resistors. An example of a cooling device may include, but is not limited to, an integrated micro-machined heat exchange IC pump.

The temperature controller 108 may be separated from the IC under test, as displayed by the solid lines in FIG. 1, or may be formed within the IC along with the temperature generation device and the temperature sensor, as indicated by the dotted lines in FIG. 1. The temperature controller 108 may be configured in a control feedback loop, coupled to both the temperature sensor 104 and the temperature generation device 106. The temperature controller 108 may send a temperature control command to the temperature generation device 106 to produce a predefined temperature. The temperature controller 108 may then receive a temperature reading from the temperature sensor 104 as an indicator of how the IC responded to the command originally sent to the temperature generation device 106. The temperature controller 108 may then respond by sending another control command to the temperature generation device 106 to maintain constant control over the temperature of the IC.

In one embodiment, the temperature controller may continuously repeat the above-described process to maintain the IC at a constant temperature. The temperature controller offsets the changes in temperature generated by the IC and other peripheral devices with a change in temperature produced by the temperature generation device.

The temperature controller 108 may be implemented in various off-the-shelf or custom built components. The temperature controller 108 may be a simple differential amplifier based comparator circuit. If a differential amplifier is used, the temperature signal provided by the temperature sensor 104 is compared to a predetermined registered setting. Depending on the difference between the predetermined registered setting and the temperature signal provided by the temperature sensor, the temperature controller will cause the temperature generation devices to increase or decrease the temperature, until the temperature reaches the desired level. Examples of more complex temperature controllers may include, but are not limited to, a Programmable Logic Device (PLD), a Field Programmable Gate Array (FPGA), a Very-Large-Scale Integration (VLSI), or a microprocessor. A personal computer (PC) may also be configured to act as the temperature controller, communicating with the IC through one of its various ports.

The system 100, 200 may further include a power management unit 110, coupled to the temperature sensors 104, 204. Often, the power management unit 110 may already be included in the IC for purposes other than testing. If such is the case, the existing power management unit may be coupled to the temperature sensors 104, 204, making the power management unit more useful than before, for reasons discussed below. However, when the power management unit is not already included in the IC, a power management unit may be provided within the IC, and coupled to the temperature sensors 104, 204. The power management unit 110 may optimize the power being used during circuit operation, may protect the IC 102 from entering a state referred to as "thermal runaway", and may prevent "latch-ups" in CMOS devices.

Most of the semiconductor has a negative temperature coefficient characteristic. Thus, when semiconductors get hot, their internal resistance levels decrease, thereby increasing the level of power being delivered to the chip. This increase in power level causes the heat to rise even further, perpetuating the cycle until the IC eventually self-destructs. This process is known as thermal runaway.

Another self-destruction process in CMOS devices is known as a "latch-up." Latch-ups are high current states induced by transient voltage spikes. Latch-ups could also be classified as another type of thermal runaway. For a reliable system, both types of thermal runaway should be avoided.

By linking the power management unit 110 to the temperature sensor 104 such that the power management unit may communicate in real-time with the temperature sensor, the power management unit may adjust the voltage and frequency of the IC 102 to ensure that the IC self adjusts, and guards against entering a thermal runaway state, and to protect against latch-ups.

In one embodiment of the invention, the IC 102 is situated within an IC wafer. By situating the IC within a wafer, multiple ICs can be tested in one setting. In another embodiment, the IC is a completely separate device. When the IC is separated from the wafer, the IC may be positioned on a circuit board populated with peripheral devices that would be present during the actual operation of the IC. Placing the IC in its actual operational environment allows the system developer or manufacturer to precisely monitor the chip temperature with the temperature sensor, and through the power management unit, ensure that the temperature does not exceed the specification.

Figure 3A:
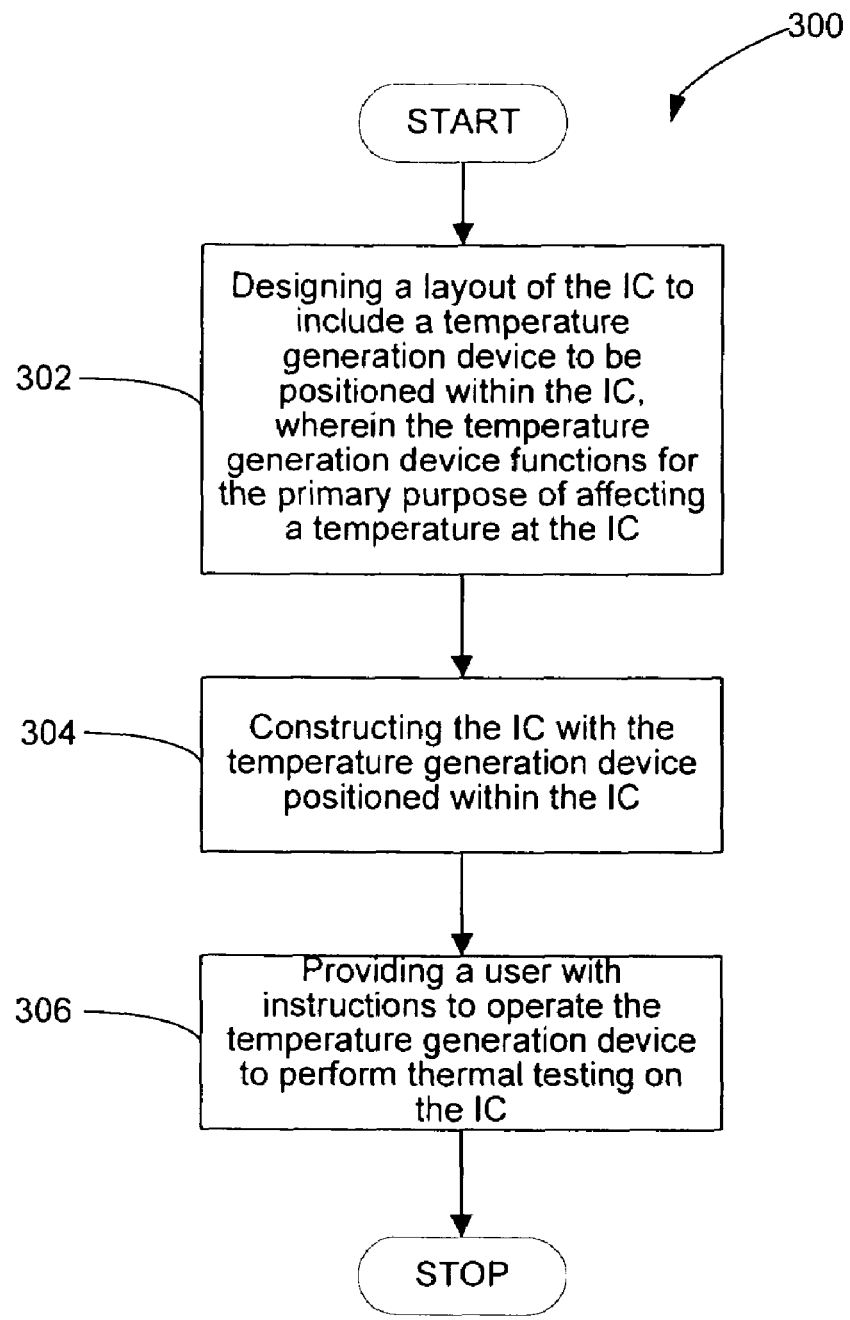
FIG. 3a is a flow diagram illustrating a method for thermally testing an IC.

In accordance with one aspect of the present invention, a method 300 shown in FIG. 3a is disclosed for preparing an IC for thermal testing. The method 300 may include designing 302 a layout of the IC to include a temperature generation device to be positioned within the IC, wherein the temperature generation device functions for the primary purpose of affecting a temperature at the IC. The method 300 may further include constructing 304 the IC with the temperature generation device positioned within the IC. Optionally, and as shown in FIG. 3a, the method 300 may further include providing 306 a user with instructions to operate the temperature generation device to perform thermal testing on the IC.

Method 300 may further include positioning a temperature sensor within close proximity to the IC, or in another embodiment, within the IC. Multiple temperature sensors and temperature generation devices may be located at various positions within the IC. A temperature controller may also be coupled to the temperature generation device(s) and the temperature sensor(s). In one embodiment, the temperature controller is also positioned within the IC.

Method 300 may further include locating the IC within an IC wafer, to enable simultaneous testing of multiple IC's within the IC wafer. However, the IC may also be separated from an IC wafer, creating an independent IC device, to enable independent testing of a single IC. Furthermore, the IC may be positioned on a circuit board that is populated with peripheral devices that would be present during actual operation of the IC to enable testing within an operating environment.

Figure 3B:
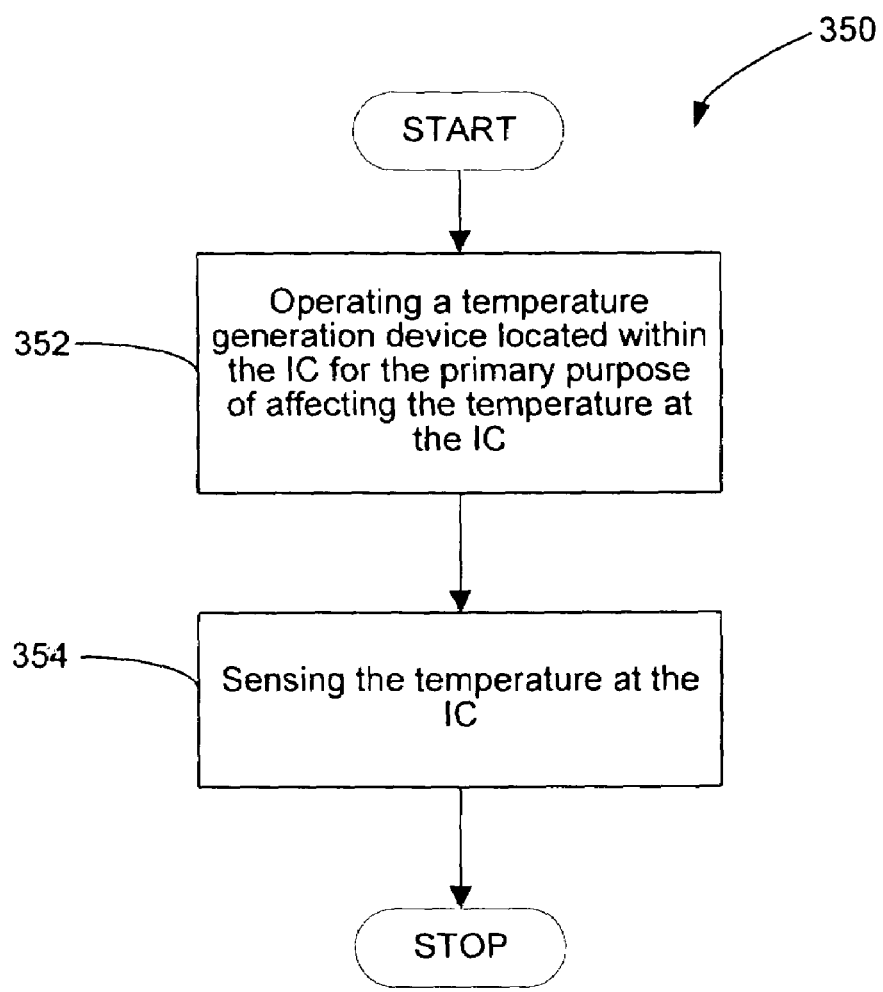
FIG. 3b is a flow diagram illustrating a method for preparing an IC for thermal testing.

In accordance with one aspect of the present invention, a method 350 shown in FIG. 3b is disclosed for thermally testing an IC. The method 350 may include operating 352 a temperature generation device located within the IC for the primary purpose of affecting the temperature at the IC. Method 350 may further include sensing 354 the temperature at the IC.

Method 350 may further include sensing the temperature at the IC using a temperature sensor located within close proximity to the IC. The temperature sensor may be located within the IC. Method 350 may further include communicating the temperature at the IC to a temperature controller.

Method 350 may further include initializing a test of the IC, presetting a target temperature to be maintained at the IC, and enabling operation of the temperature sensor. The temperature generation device may be enabled and regulated until a temperature associated with the IC reaches the target temperature. The method may further include initializing a functional test for the IC. The method may further include offsetting the temperature associated with the IC with a change in regulation of the temperature generation device to achieve the target temperature during the functional test to the IC. By applying such a thermal test to an operating IC, a batch of corresponding IC devices can be certified as effective up to a specified temperature threshold. Other methodologies can be adapted for defining various temperature-sensitive parameters for an IC and will be within the ability of those skilled in the art.

Methods 350 may also include a means to ensure that the IC does not reach an intolerable level of heat, possibly causing permanent damage. One means of doing so is to configure the temperature sensor to communicate in real-time with a power management unit within the IC. The power management unit may adjust the voltage and frequency of the IC to ensure that the IC does not enter a state of thermal runaway.

Additionally, method 350 may include predefining a maximum allowable temperature for the IC. Monitoring and controlling the maximum allowable temperature may be included as part of the functions of the temperature controller. When the maximum allowable temperature has been reached, a warning signal may be provided by the system, or a power shutdown of the IC may occur.

Figure 4:
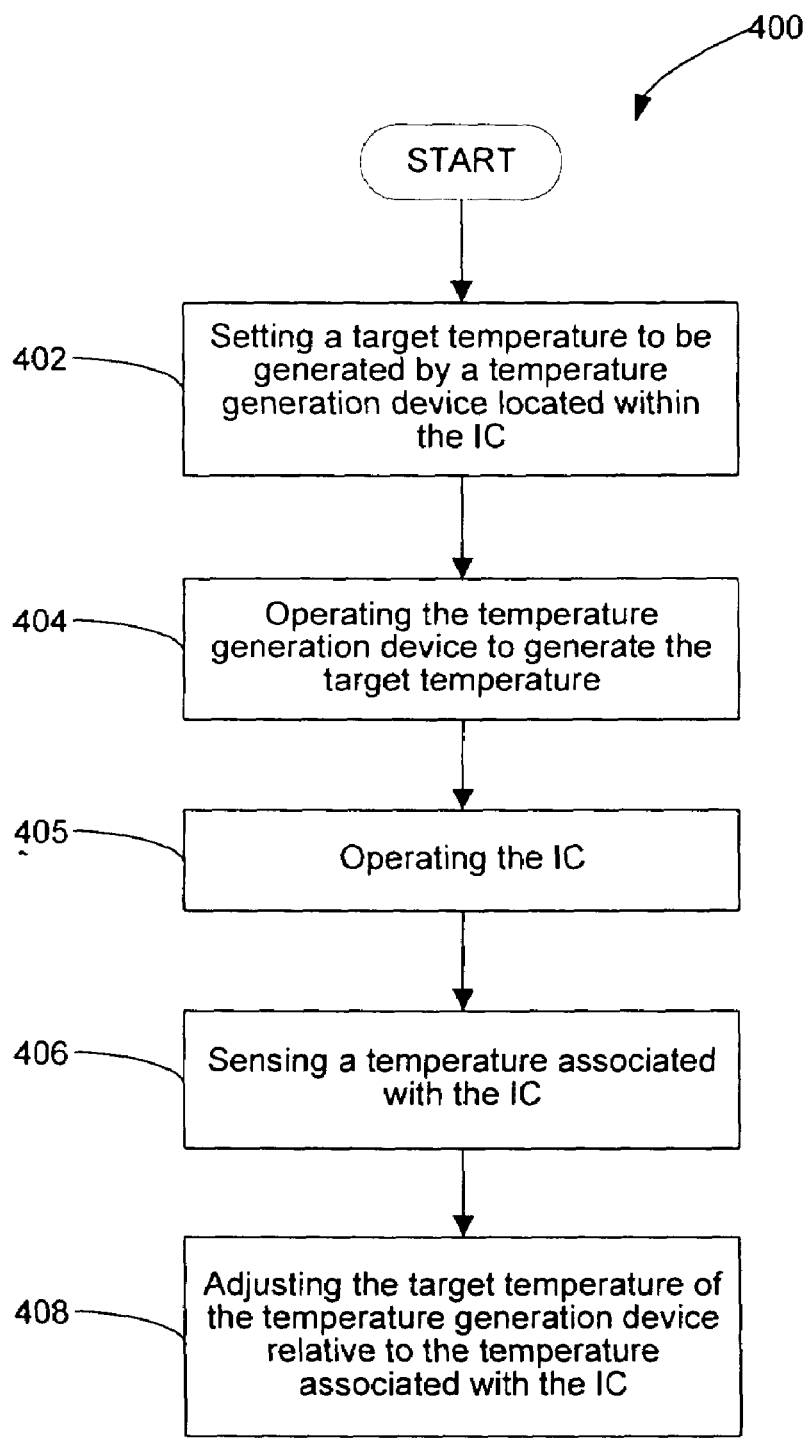
FIG. 4 illustrates an additional flow diagram of a second embodiment of the present invention.

In FIG. 4, a method 400 is shown, in accordance with another embodiment of the invention, for testing heat sensitive characteristics of an IC. First, a target temperature to be generated by a temperature generation device located within the IC is set 402. Second, the temperature generation device is operated 404 to generate the target temperature. Third, the IC is operated 405. Fourth, a temperature associated with the IC is sensed 406. Fifth, the target temperature of the temperature generation device is adjusted 408 relative to the temperature associated with the IC.

Method 400 may further include communicating the temperature associated with the IC to a temperature controller. The temperature controller may also be used to adjust the target temperature depending on the temperature associated with the IC, and to instruct the temperature generation device to generate the target temperature. The temperature controller may be installed within the IC.

The method 400 may also include maintaining the temperature associated with the IC at a substantially constant level. This is accomplished by noting a change in the temperature sensed by the temperature sensors within the IC. These changes are offset by adjusting the temperature generated by the temperature generation device. The logic of maintaining the temperature associated with the IC at a constant level may be performed by the temperature controller.

While testing the heat sensitive characteristics of an IC using the above methods, a functional test of the IC may be initialized in order to closely simulate the operating conditions of the IC. Further tests may be performed to monitor the data or output of the IC's functional test to determine the range of temperatures in which the IC operates properly. A functional test of the IC may produce power surges within the IC, thereby changing the temperature of the IC. Because the temperature sensor and temperature generation device of the disclosed method and system are located within the IC, even sudden changes of temperature caused by the functional test and by other environmental factors can be accounted for and compensated for. Previous attempts to account for and compensate for sudden changes of temperature within the IC caused by a functional test were largely unsuccessful because temperature generation devices and/or temperature sensors were not located within the IC.

Figure 5:
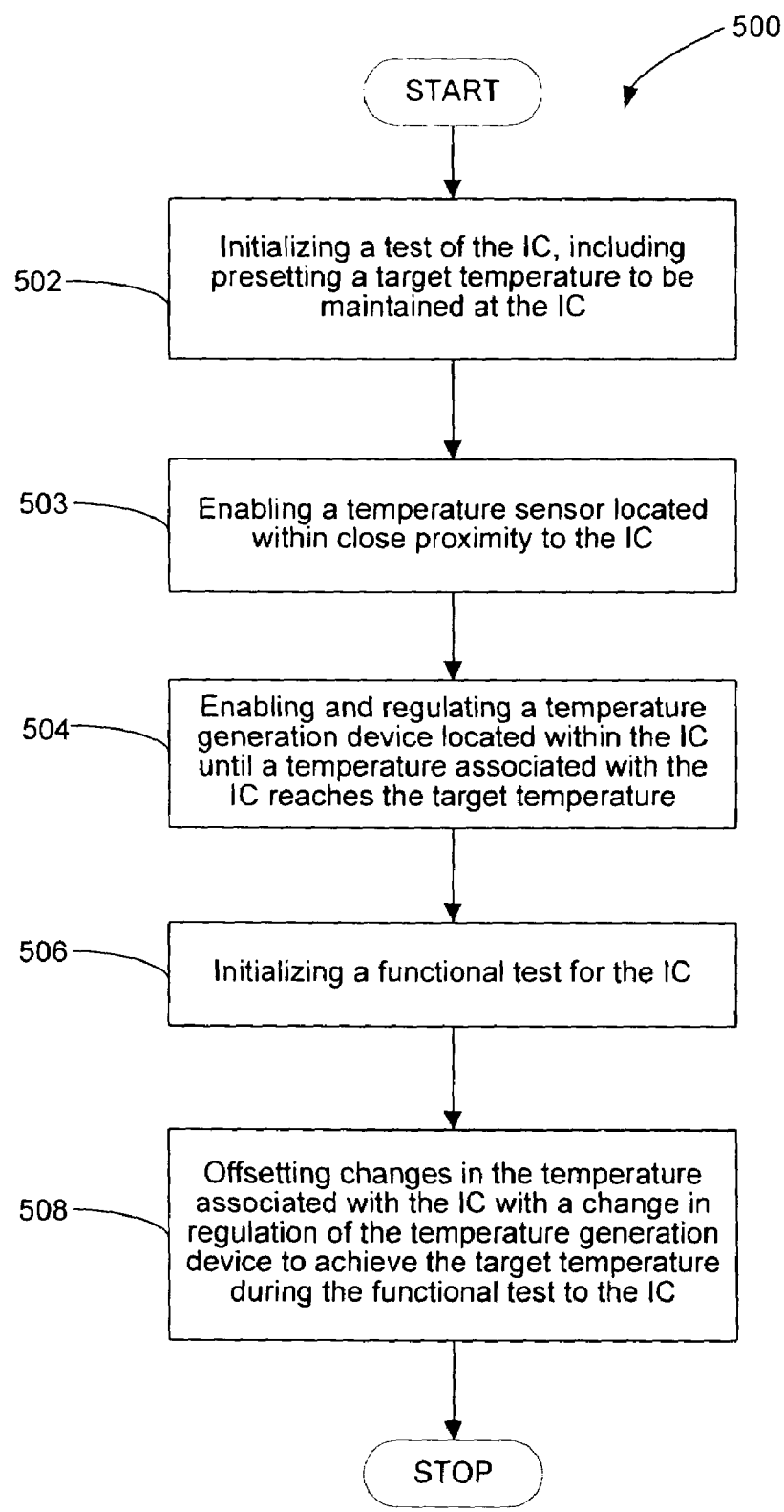
FIG. 5 is a flow diagram illustrating a method for thermally testing an IC by maintaining a constant temperature at the IC.

FIG. 5 is a flow chart illustrating a method 500, in accordance with one embodiment of the invention, which describes thermally assisted testing of an integrated circuit (IC) by maintaining the IC at a constant temperature during a functional test. The method 500 may include initializing 502 a test of the IC, including presetting a target temperature to be maintained at the IC. The method may further include enabling 503 a temperature sensor located within close proximity to, or even within the IC. The method may further include enabling 504 and regulating a temperature generation device located within the IC until a temperature associated with the IC reaches the target temperature. The method may further include initializing 506 a functional test for the IC. The method may further include offsetting 508 temperatures generated by the IC with a change in regulation of the temperature generation device to achieve the target temperature during the functional test to the IC.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the claims.

What is claimed is:

1. A method of preparing an integrated circuit (IC) for thermal testing, the method comprising:

designing a layout of the IC to include a plurality of temperature generation devices to be positioned within the IC, wherein the temperature generation devices functions for a primary purpose of affecting a temperature at the IC;

designing a layout of the IC to include a plurality of temperature sensor devices to be positioned within the IC; and constructing the IC with the plurality of temperature generation devices and the plurality of temperature sensors positioned within the IC.

2. The method according to claim 1, further comprising providing a user with instructions to operate the temperature generation device to perform thermal testing on the IC.

3. The method according to claim 1, further comprising the step of positioning a temperature sensor within close proximity to the IC.

4. The method according to claim 3, further comprising the step of providing a temperature controller coupled to the plurality of temperature generation devices and the plurality of temperature sensors.

5. The method according to claim 4, comprising the more specific step of positioning the temperature controller within the IC.

6. The method according to claim 1, further comprising the step of locating the IC within an IC wafer.

7. The method according to claim 1, further comprising the step of separating the IC from an IC wafer, creating an independent IC device.

8. The method according to claim 1, further comprising the step of positioning the IC on a circuit board that is populated with peripheral devices which would be present during actual operation of the IC.

9. A method for thermally testing an integrated circuit (IC), the method comprising:

operating a plurality of temperature generation devices located within the IC for the primary purpose of affecting a temperature at the IC; and sensing the temperature at the IC with a plurality of temperature sensor devices located within the IC.

10. The method according to claim 9, including the more specific step of sensing the temperature at the IC using a temperature sensor located within close proximity to the IC.

11. The method according to claim 10, further comprising the steps of:

initializing a test of the IC, including presetting a target temperature to be maintained at the IC;

enabling the plurality of temperature sensors;

enabling and regulating the plurality of temperature generation devices until the temperature at the IC reaches the target temperature;

initializing a functional test for the IC; and offsetting changes in the temperature at the IC with a change in regulation of the plurality of temperature generation devices to achieve the target temperature during the functional test to the IC.

12. The method according to claim 10, further comprising the step of applying the plurality of temperature sensors to communicate in real-time with an integrally formed power management unit used with the IC for a primary purpose of adjusting voltage levels and frequency of the IC.

13. The method according to claim 9, further comprising the step of communicating the temperature at the IC to a temperature controller.

14. The method according to claim 9, further comprising the step of predefining a maximum allowable temperature for the IC.

15. A method for thermally assisted testing of an integrated circuit (IC), the method comprising:

(a) setting a target temperature to be generated by a plurality of temperature generation devices located within the IC;

(b) operating the plurality of temperature generation devices to generate the target temperature;

(c) operating the IC;

(d) sensing a temperature associated with the IC with a plurality of temperature sensing devices; and (d) adjusting the target temperature of at least one of the plurality of temperature generation devices relative to the temperature associated with the IC.

16. The method according to claim 15, further comprising the step of communicating the temperature associated with the IC to a temperature controller.

17. The method according to claim 16, comprising the more specific step of using the temperature controller to adjust the target temperature depending on the temperature associated with the IC, and to instruct the plurality of temperature generation devices to generate the target temperature.

18. The method according to claim 15, further comprising the step of initializing a functional test of the IC.

19. The method according to claim 15, further comprising the step of configuring the temperature controller to maintain the temperature associated with the IC at a substantially constant temperature by offsetting changes in the temperature associated with the IC and any peripheral devices with a change in the target temperature to be generated by the plurality of temperature generation devices.

20. A system for thermally assisted testing of an integrated circuit (IC), comprising:

at least two temperature generation devices located within the IC and configured for a primary purpose of affecting a temperature at the IC;

at least two temperature sensors located within close proximity to the IC; and a temperature controller coupled to the at least two temperature generation devices and to the at least two temperature sensors.

21. The system according to claim 20, wherein the device is also comprised of a power management unit electronically coupled to the at least two temperature sensors and configured for adjusting voltage levels and frequency of the IC, wherein the power management unit communicates in real-time with the temperature sensor.

22. The system according to claim 20, wherein the at least two temperature sensors are installed within the IC.

23. The system according to claim 20, wherein the temperature controller is installed within the IC.

24. A method for thermally assisted testing of an integrated circuit (IC), the method comprising:

initializing a test of the IC, including presetting a target temperature to be maintained at the IC;

enabling a temperature sensor located within close proximity to the IC;

enabling and regulating a temperature generation device located within the IC until a temperature associated with the IC reaches the target temperature;

initializing a functional test for the IC; and offsetting changes in the temperature associated with the IC with a change in regulation of the temperature generation device to achieve the target temperature during the functional test to the IC.

25. The method according to claim 24, comprising the more specific step of installing the temperature sensor within the IC.

* * * * *

UNITED STATES PATENT AND TRADEMARK OFFICE
CERTIFICATE OF CORRECTION

PATENT NO. : 7,087,439 B2  Page 1 of 1
APPLICATION NO. : 10/655892
DATED : August 8, 2006
INVENTOR(S) : Joseph Weiyeh Ku It is certified that error appears in the above-identified patent and that said Letters Patent is hereby corrected as shown below:

In column 6, line 66, in Claim 1, delete "functions" and insert -- function --, therefor.

Signed and Sealed this

Third Day of March, 2009

JOHN DOLL
*Acting Director of the United States Patent and Trademark Office*